United States Patent
Majhi et al.

(10) Patent No.: US 12,302,643 B2
(45) Date of Patent: *May 13, 2025

(54) BACKEND ELECTROSTATIC DISCHARGE DIODE APPARATUS AND METHOD OF FABRICATING THE SAME

(71) Applicant: Intel Corporation, Santa Clara, CA (US)

(72) Inventors: Prashant Majhi, San Jose, CA (US); Ilya Karpov, Portland, OR (US); Brian Doyle, Portland, OR (US); Ravi Pillarisetty, Portland, OR (US); Abhishek Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 688 days.

This patent is subject to a terminal disclaimer.

(21) Appl. No.: 17/572,437

(22) Filed: Jan. 10, 2022

(65) Prior Publication Data

US 2022/0130820 A1    Apr. 28, 2022

Related U.S. Application Data

(63) Continuation of application No. 15/940,899, filed on Mar. 29, 2018, now Pat. No. 11,222,885.

(51) Int. Cl.
  *H10D 89/60*    (2025.01)
  *H10D 8/00*    (2025.01)

(52) U.S. Cl.
  CPC ........... *H10D 89/611* (2025.01); *H10D 8/422* (2025.01)

(58) Field of Classification Search
  CPC ...... H01L 29/861–885; H01L 27/0255; H10D 84/204; H10D 84/221; H10D 86/80–85; H10D 8/422
  See application file for complete search history.

(56) References Cited

U.S. PATENT DOCUMENTS

| 11,222,885 B2 * | 1/2022 | Majhi ................. H01L 27/0255 |
| 2007/0015330 A1 | 1/2007 | Li et al. |
| 2014/0264375 A1 | 9/2014 | Ma et al. |

OTHER PUBLICATIONS

Non-Final Office Action from U.S. Appl. No. 15/940,899 notified Jun. 8, 2021, 7 pgs.
Notice of Allowance from U.S. Appl. No. 15/940,899 notified Sep. 22, 2021, 5 pgs.

* cited by examiner

*Primary Examiner* — Daniel P Shook
(74) *Attorney, Agent, or Firm* — Essential Patents Group, LLP

(57) ABSTRACT

A backend electrostatic discharge (ESD) diode device structure is presented comprising: a first structure comprising a first material, wherein the first material includes metal; a second structure adjacent to the first structure, wherein the second structure comprises a second material, wherein the second material includes a semiconductor or an oxide; and a third structure adjacent to the second structure, wherein the third structure comprises the first material, wherein the second structure is between the first and third structures.

20 Claims, 10 Drawing Sheets

BACKEND ELECTROSTATIC DISCHARGE DIODE APPARATUS AND METHOD OF FABRICATING THE SAME

CLAIM OF PRIORITY

This application is a continuation of, and claims the benefit of priority to, U.S. patent application Ser. No. 15/940,899, filed on Mar. 29, 2018 and titled "BACKEND ELECTROSTATIC DISCHARGE DIODE APPARATUS AND METHOD OF FABRICATING THE SAME," which is incorporated by reference in entirety.

BACKGROUND

Diodes are a common circuit element used in integrated circuits (ICs). Diodes are useful for protecting circuitry from over-voltages, such as those associated with electrostatic discharge (ESD) events. Absent a protection circuit, discharge through a device such as a transistor, can cause catastrophic damage to an IC. Diode protection circuits may therefore be configured as part of a functional IC to shunt surges in potential away from circuitry that could otherwise be damaged.

As Complementary Metal Oxide Semiconductor (CMOS) is scaled into the deep fin field effect transistor (FinFET) era, it becomes increasingly difficult to utilize bulk Silicon (Si) to form diodes for ESD protection. One issue with the previous solutions (formed on bulk Si and Silicon-on-Insulator (SOI) technologies) is the lack of available active Si in the highly scaled finFET process technology nodes. Further, in newer process technology nodes there is concern about thermal stability and breakdown of new materials used for diodes. This concern is typically attributed to current spikes during metal to insulator transition, for example.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1A:
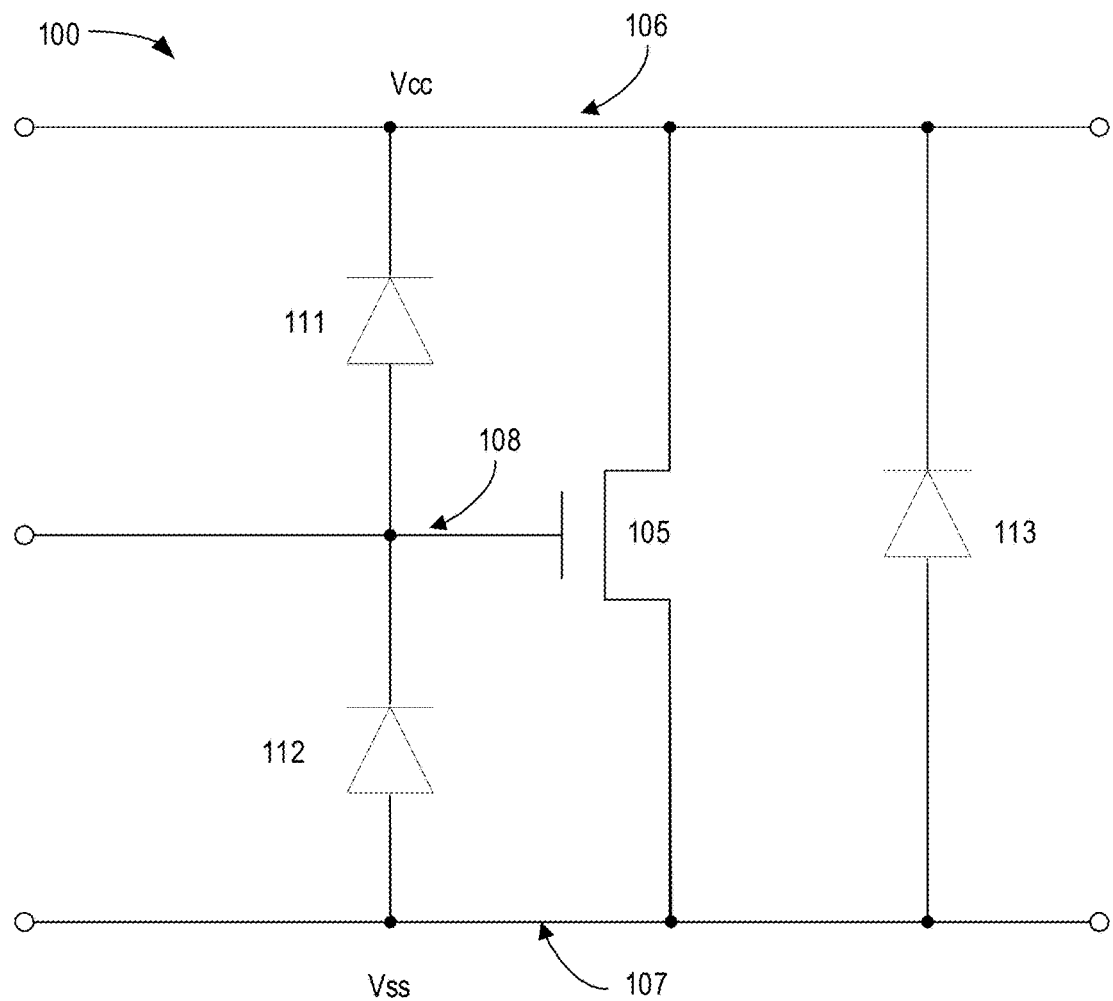
FIGS. 1A and 1B illustrate schematics of diode protection circuits, in accordance with some embodiments.

Some embodiments create ESD diodes by engineering MIM (metal insulator metal) or MSM (metal semiconductor metal) stacks that can be realized in backend processing of conventional CMOS process. Some embodiments use the field modulated conduction through engineered MIM or MSM stacks to achieve ESD diode characteristics. In some embodiments, the "insulator" and "semiconductor" can be a stack of insulators or semiconductors with engineered band offsets. The MSM/MIM diode structures enable a backend compatible ESD diode, and are therefore advantageous because they offer lower integration cost, enable usage of simple thin film process and are scalable and tunable to Vcc range.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The term "device" may generally refer to an apparatus according to the context of the usage of that term. For example, a device may refer to a stack of layers or structures, a single structure or layer, a connection of various structures having active and/or passive elements, etc. Generally a device is a three dimensional structure with a plane along the x-y direction and a height along the z direction of an x-y-z Cartesian coordinate system. The plane of the device may also be the plane of an apparatus which comprises the device.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

The terms "left," "right," "front," "back," "top," and "bottom" and the like in the description and in the claims, if any, are used for descriptive purposes and not necessarily for describing permanent relative positions.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/-10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

It is pointed out that those elements of the figures having the same reference numbers (or names) as the elements of any other figure can operate or function in any manner similar to that described, but are not limited to such.

FIG. 1A illustrates a schematic of an electrical circuit 100 including at least one MSM/MIM Backend ESD diode which is realized in the backend of the integrated circuit. The MSM/MIM diode structures enabling a backend compatible ESD diode are advantageous because they offer lower integration cost, enable usage of simple thin film process and are scalable and tunable to Vcc range.

Circuit 100 can be implemented as a single IC chip and may be implemented in any electronic device, such as, but not limited to, smartphones, ultrabook computers, embedded devices (e.g., internet of things, automotive applications, etc.), or wearables. In circuit 100, a transistor 105 is to be protected from electrical surges by diodes 111, 112, and 113. Transistor 105 includes a first terminal (e.g., source) coupled to a first supply rail 106 maintained at a nominal supply voltage (e.g., Vcc), and a second terminal (e.g., drain) coupled to second supply rail 107 maintained at a nominal reference voltage (e.g., Vss). A third terminal (e.g., gate) of transistor 105 is coupled to a signal input 108, which conveys an input voltage Vin. In circuit 100, transistor 105 is protected by diodes 111 and 112 connecting signal input 108 to the supply rails 106, 107 (e.g., Vcc and Vss, respectively), and by diode 113 connecting supply rail 106 to supply rail 107.

Under normal operating conditions, diodes 111, 112 and 113 are maintained in the off-state (e.g., reverse biased) such that signal input 108 is effectively disconnected from supply rails 106, 107 while transistor 105 is driven by the supply voltage across rails 106, 107. However, upon experiencing a potential surge between signal input 108 and supply rails 106 and 107, the transient will forward bias one or more of diodes 111, 112 and 113, turning them on. Which of diodes 111, 112 and 113 become forward biased is dependent on the charge polarity of the surge relative to the supply rail potentials. Charge accumulated at voltage input 108 is thereby dissipated or shunted through the diode path around transistor 105. In accordance with some embodiments, one or more diodes of a protection circuit (e.g., diodes 111, 112 and 113) employ a MSM/MIM structure realized in the backend. Such backend diode device structures may have one or more of the features described further below. Any of the MSM/MIM backend diode integrated devices described herein may also be employed in any other suitable protection circuit designs. Any of the MSM/MIM backend diode structure integrated devices described further herein may also be employed in circuits having functions other than ESD protection, such as, but not limited to, high voltage power management circuitry. The MSM/MIM diodes of various embodiments can be used for any diode function. For example, MSM/MIM diode can be used as a thermal sensor diode for a processor.

Figure 1B:
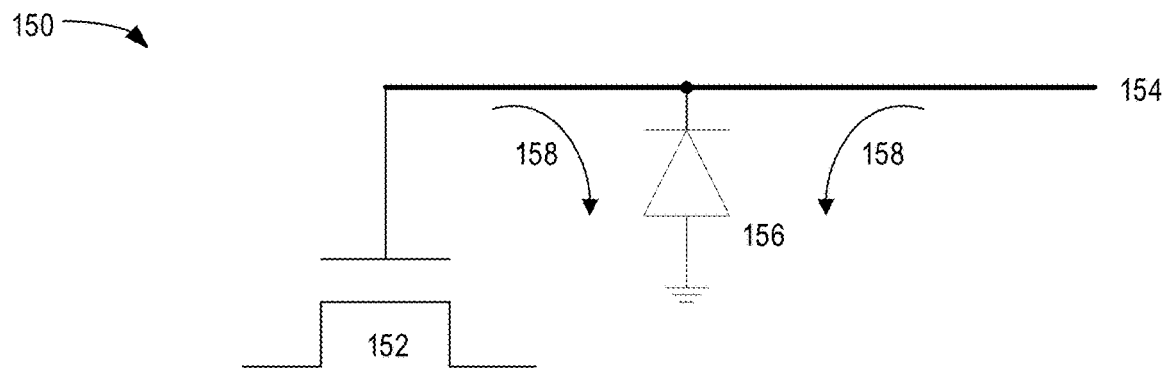

FIG. 1B illustrates a schematic of an electrical circuit 150 including at least one MSM/MIM backend diode integrated or embedded within the backend. In circuit 150, a transistor 152 is to be protected from antenna effects by antenna diode 156. Transistor 152, and in particular a thin layer gate oxide, may be vulnerable to damage from antenna effects as metal interconnects 154 are formed and processed above the gate. Plasma etching, for example, could lead to an overvoltage due to charge accumulation. Antenna diode 156 may provide charge dissipation path 158 to protect transistor 152 during the manufacturing processes. During normal operation, antenna diode 156 would not hinder transistor 152 provided the turn on voltage of transistor 152 is less than the turn on voltage of antenna diode 156.

Figure 2A:
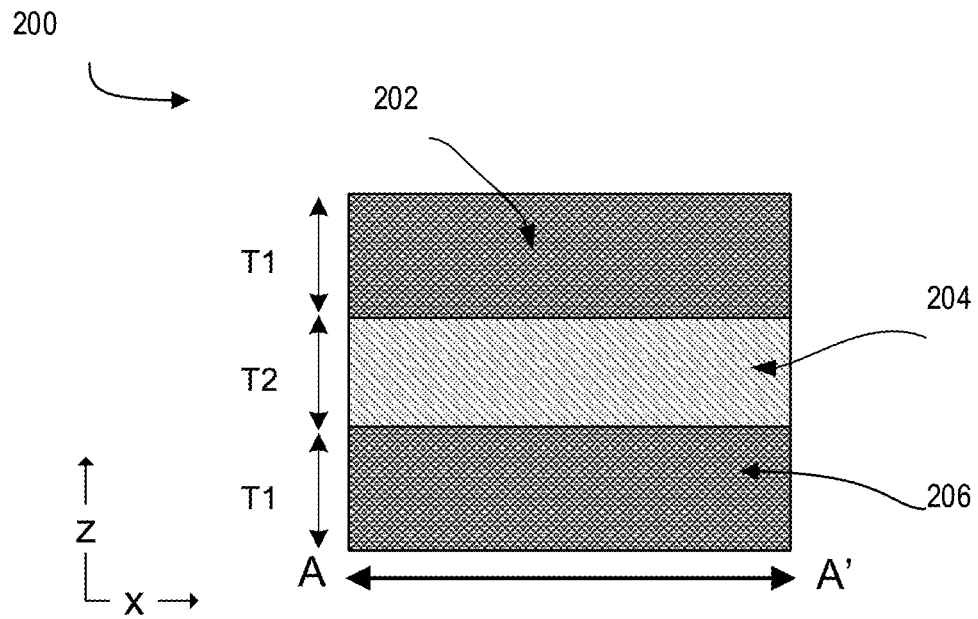
FIGS. 2A and 2B illustrate a plan view of a cross-sectional view and a corresponding three dimensional (3D) view, respectively, of a backend ESD Diode, in accordance with some embodiments.
Figure 2B:
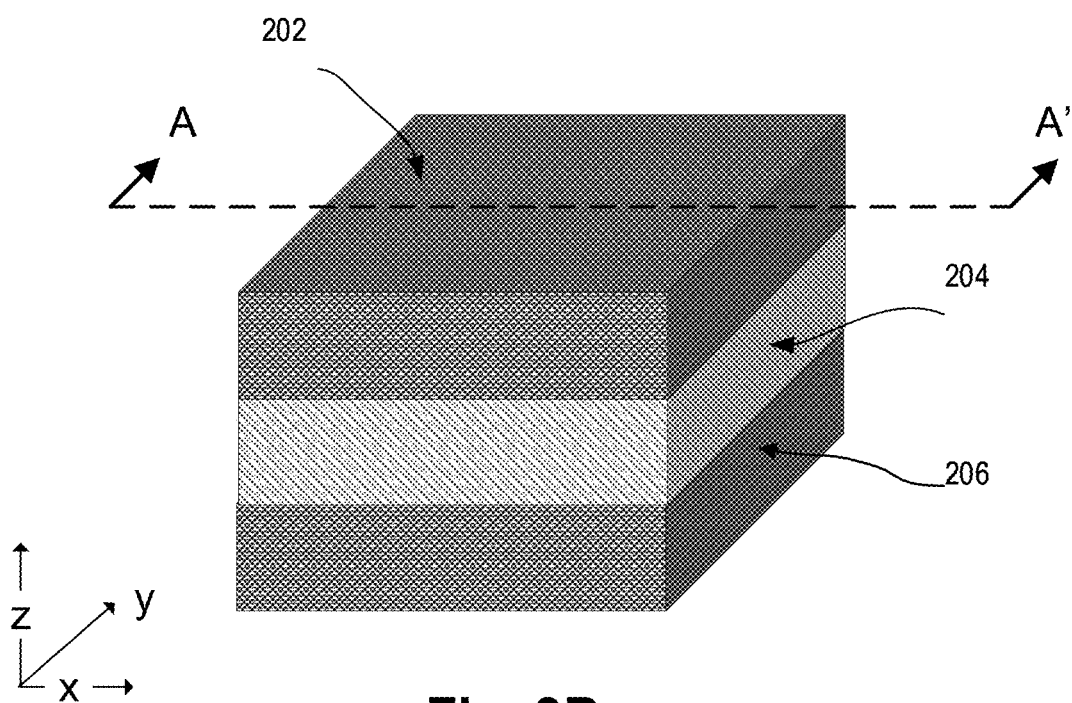

FIGS. 2A-B illustrates a cross-sectional view and corresponding three dimensional (3D) view of IC device structure 200, in accordance with some embodiments. As shown in FIGS. 2A-B, device structure 200 may include a first structure 202, a second structure 204, and a third structure 206.

In some embodiments, first structure 202 may comprise a metal material. In some embodiments, the metal material may include one or more of: Ru, N, Ti, Ta, Al, N, W, Ir, Si, C, or Mo. For example, the metal material may include one of: TiN, TaN, TiAlN, TiSiN, TaC or TaAln. In other embodiments, the metal material may include a compound of: Ru, N, Ti, Ta, Al, N, W, Ir, Si, C, or Mo.

In some embodiments, second structure 204 may include an insulator or a semiconductor material. In some embodiments, the insulator or semiconductor material includes at least one of: Mg, Al, Si, Ga, Ge, O, Hf, Ti, Ta, Zr, W, or Ni. For example, the material of the second structure 204 may include: HfOx, TiOx, TaOx, NiOx, SiGe, ZrOx, WOx. In other embodiments, the metal material of the second structure 204 may include a compound of: Mg, Al, Si, Ga, Ge, O, Hf, Ti, Ta, Zr, W, or Ni.

In some embodiments, third structure 206 may comprise a metal material. In some embodiments, the metal material of the third structure 206 may include: Ru, N, Ti, Ta, Al, N, W, Ir, Si, C, or Mo. In other embodiments, the metal material of the third structure 206 may include a compound made of: Ru, N, Ti, Ta, Al, N, W, Ir, Si, C, or Mo. For example, the metal material of the third structure 206 may include one of: TiN, TaN, TiAlN, TiSiN, TaC or TaAln. In some embodiments, the first or third structures have a thickness (T1) in a range of 5 nm to 20 nm. In some embodiments, the second structure (T2) has a thickness in a range of 1 nm to 4 nm.

Figure 3A:
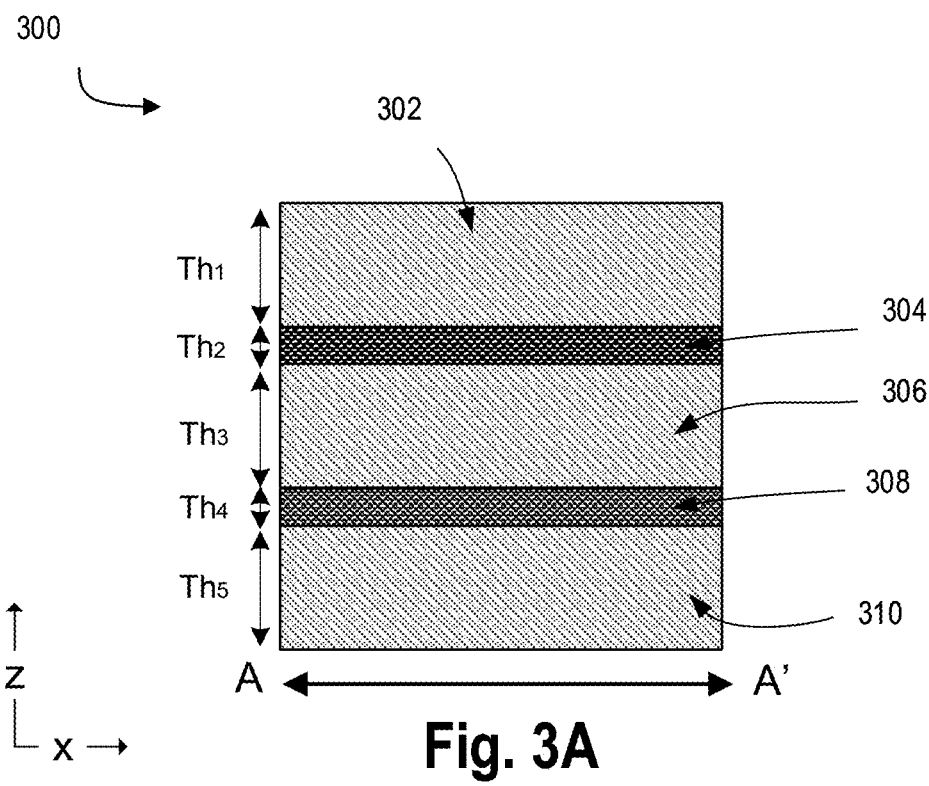
FIGS. 3A and 3B illustrate a cross-sectional view and corresponding 3D view, respectively, of a heterostructure of the embedded diode shown in FIG. 2, in accordance with some embodiments.
Figure 3B:
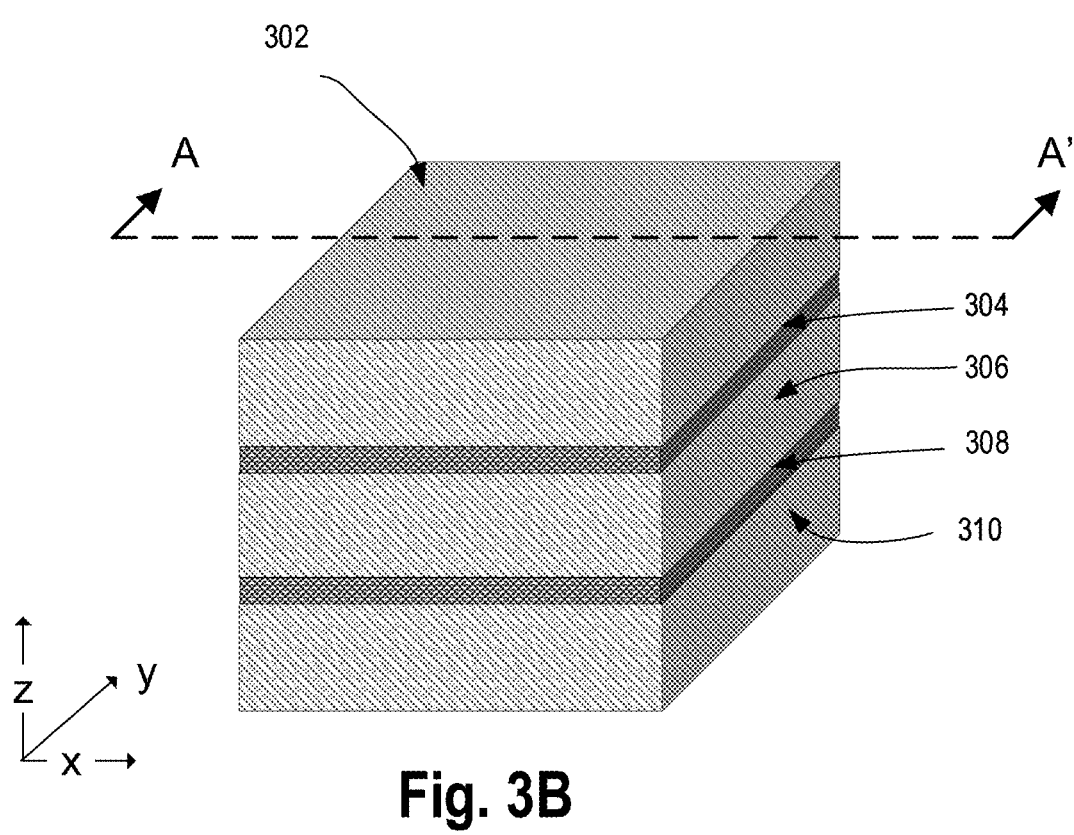

FIG. 3A-B illustrate a cross-sectional view and corresponding three dimensional (3D) view, respectively, of the second structure 204, in accordance with some embodiments. As shown in FIGS. 3A-B, in some embodiments, second structure 204 may be a hetero-structure, a stack of insulators (304, 308) or semiconductors material (302, 306, 310) with engineered band offsets. In some embodiments, the stack of insulator and semiconductor material of the hetero-structure are repeated at least 2 or more times. In some embodiments the insulator or semiconductor layer material includes at least one of: Mg, Al, Si, Ga, Ge, 0, Hf, Ti, Ta, Zr, W, or Ni. In other embodiments, the second structure may be doped by a doping material, and the doping material may include at least one of: a Trivalent element, a Pentavalent element, arsenic, boron, phosphorus, or Gallium. In some embodiments, the insulators layer material (304, 308) have a thickness (Th2, Th4) in a range of 0.2 nm to 4 nm. In some embodiments, the semiconductors layer material (302, 306, 310) have a thickness (Th1, Th3, Th5) in a range of 0.2 nm to 4 nm.

The backend devices described here may be fabricated using a variety of methods.

Figure 4A:
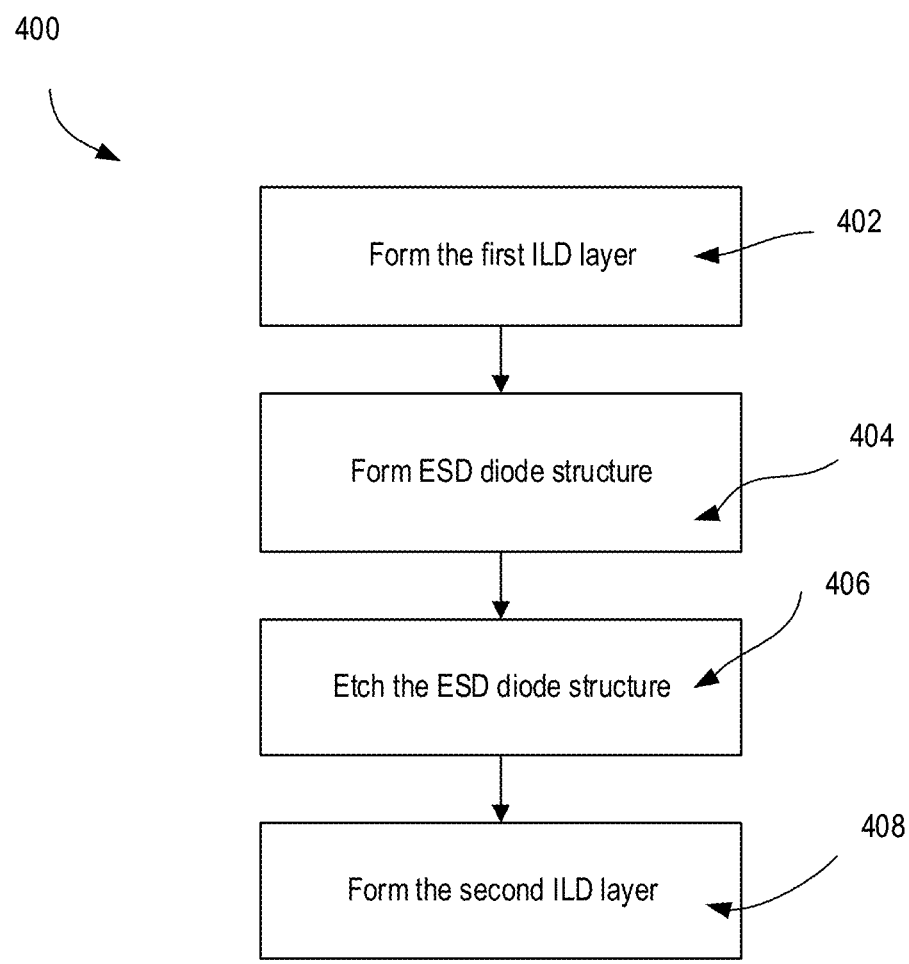
FIG. 4A illustrates a flow diagram illustrating methods of forming the backend ESD Diode structures including an embedded diode, in accordance with some embodiments.

FIG. 4A illustrates a flow diagram illustrating methods 400 for forming the backend ESD Diode, in accordance with some embodiments.

Methods 400 begin at operation 402 where a first interlayer dielectric (ILD) or inter-metal dielectric (IMD) is received. The first ILD includes a spaced patterned metal interconnect lines. ILD and IMD are dielectric materials used to electrically separate closely spaced interconnect lines arranged in several levels (multilevel metallization) in an advanced integrated circuit. Typically, ILD features low dielectric constant k (e.g., as close to 1 as possible) to minimize capacitive coupling ("cross talk") between adjacent metal lines.

At operation 404, the ESD diode structure is deposited on the ILD. The formation process may further entail first forming the metallic structure (206). Any suitable deposition process may be employed, for example to form any of the metallic layer described above. The operation 404 continues with depositing the second insulator or semiconductor structure (204). Any suitable deposition process may be employed, for example to form any of the second structure described above. Next, operation 404 continues with depositing the metallic structure (202). Any suitable deposition process may be employed, for example to form any of the metallic structure.

In some embodiments, the metal material may include one or more of: Ru, N, Ti, Ta, Al, N, W, Ir, Si, C, or Mo. For example, the metal material may include one of: TiN, TaN, TiAlN, TiSiN, TaC or TaAln. In other embodiments, the metal material may include a compound of: Ru, N, Ti, Ta, Al, N, W, Ir, Si, C, or Mo.

In some embodiments, the insulator or semiconductor material includes at least one of: Mg, Al, Si, Ga, Ge, O, Hf, Ti, Ta, Zr, W, or Ni. For example, the material of the second structure 204 may include: HfOx, TiOx, TaOx, NiOx, SiGe, ZrOx, WOx. In other embodiments, the metal material of the second structure 204 may include a compound of: Mg, Al, Si, Ga, Ge, O, Hf, Ti, Ta, Zr, W, or Ni.

In other embodiments, the second structure may be doped by a doping material, and the doping material may include at least one of: a Trivalent element, a Pentavalent element, arsenic, boron, phosphorus, or Gallium.

At operation 406, the ESD diode structure deposited on the first ILD layer is etched. The etching is done such that the diode structure is coupled to merely a selected metallic interconnect line in the first ILD layer. Etching is used in semiconductor fabrication to chemically remove layers from the surface of a wafer during manufacturing. Any suitable etching process may be employed, for example to etch any of the ESD diode structure.

Methods 400 completes at operation 408 where the second ILD is formed. The operation is performed such that the ESD diode structure is coupled to merely a selected metallic interconnect line in the second ILD.

Figure 4B:
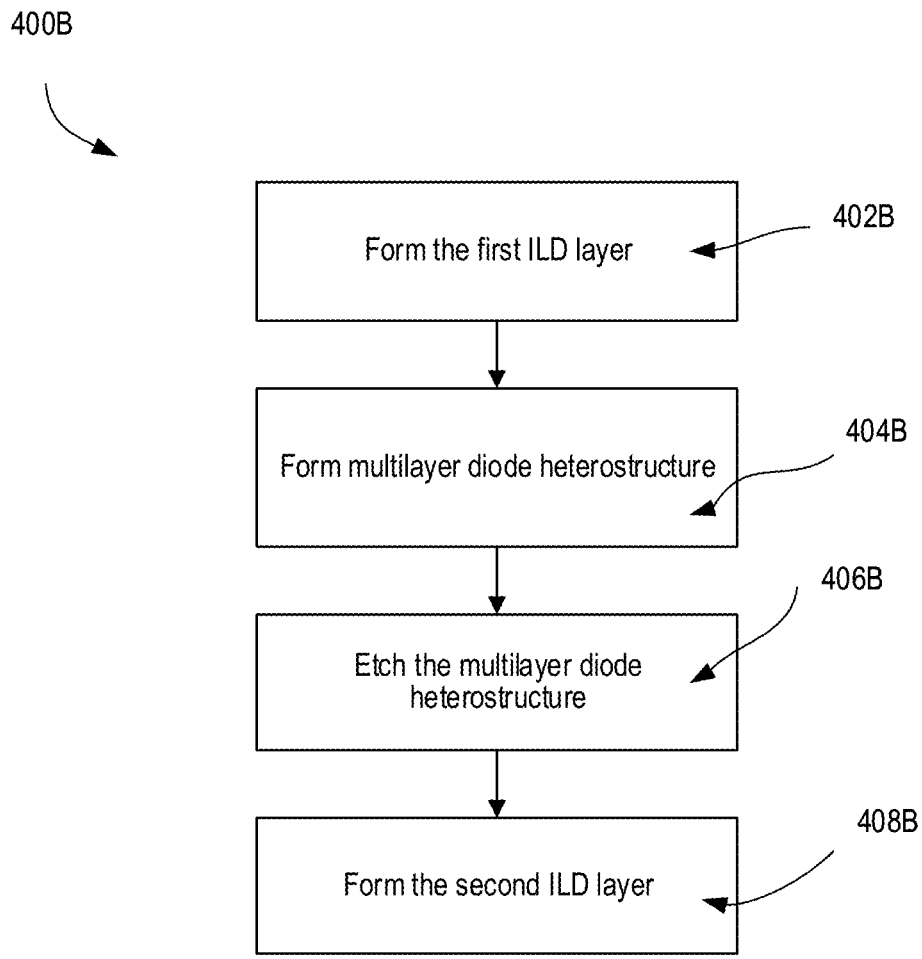
FIG. 4B illustrates a flow diagram illustrating methods of forming the multilayer Diode heterostructure including an embedded diode, in accordance with some embodiments.

FIG. 4B illustrates a flow diagram illustrating methods 400B for forming the backend ESD Diode, in accordance with some other embodiments.

Methods 400B begin at operation 402B where a first interlayer dielectric (ILD) or inter-metal dielectric (IMD) is received. The first ILD includes a spaced patterned metal interconnect lines. ILD and IMD are dielectric materials used to electrically separate closely spaced interconnect lines arranged in several levels (multilevel metallization) in an advanced integrated circuit. Typically, ILD features low dielectric constant k (e.g., as close to 1 as possible) to minimize capacitive coupling ("cross talk") between adjacent metal lines.

At operation 404B, the multilayer diode hetero-structure is deposited on the ILD. The formation process may further entail first forming the metallic structure (206). Any suitable deposition process may be employed, for example to form any of the metallic layer described above. The operation 404B continues with depositing the second insulator or semiconductor heterostructure (300). Any suitable deposition process may be employed, for example to form any of the second heterostructures described here. In some embodiments, the stack of insulator and semiconductor material of the hetero-structure are repeated at least 2 or more times. Next, operation 404B continues with depositing the metallic structure (202). Any suitable deposition process may be employed, for example to form any of the metallic structure.

In some embodiments, the metal material may include one or more of: Ru, N, Ti, Ta, Al, N, W, Ir, Si, C, or Mo. For example, the metal material may include one of: TiN, TaN, TiAlN, TiSiN, TaC or TaAln. In other embodiments, the metal material may include a compound of: Ru, N, Ti, Ta, Al, N, W, Ir, Si, C, or Mo.

In some embodiments the insulator or semiconductor layer material includes at least one of: Mg, Al, Si, Ga, Ge, O, Hf, Ti, Ta, Zr, W, or Ni. In other embodiments, the second structure may be doped by a doping material, and the doping material may include at least one of: a Trivalent element, a Pentavalent element, arsenic, boron, phosphorus, or Gallium.

In other embodiments, the second structure may be doped by a doping material, and the doping material may include at least one of: a Trivalent element, a Pentavalent element, arsenic, boron, phosphorus, or Gallium.

At operation 406B, the multilayer diode hetero-structure deposited on the first ILD layer is etched. The etching is done such that the multilayer diode hetero-structure is coupled to merely a selected metallic interconnect line in the first ILD layer. Etching is used in semiconductor fabrication to chemically remove layers from the surface of a wafer during manufacturing. Any suitable etching process may be employed, for example to etch any of the multilayer diode hetero-structure structure.

Methods 400B completes at operation 408B where the second ILD is formed. The operation is performed such that the multilayer diode hetero-structure is coupled to merely a selected metallic interconnect line in the second ILD.

Figure 5A:
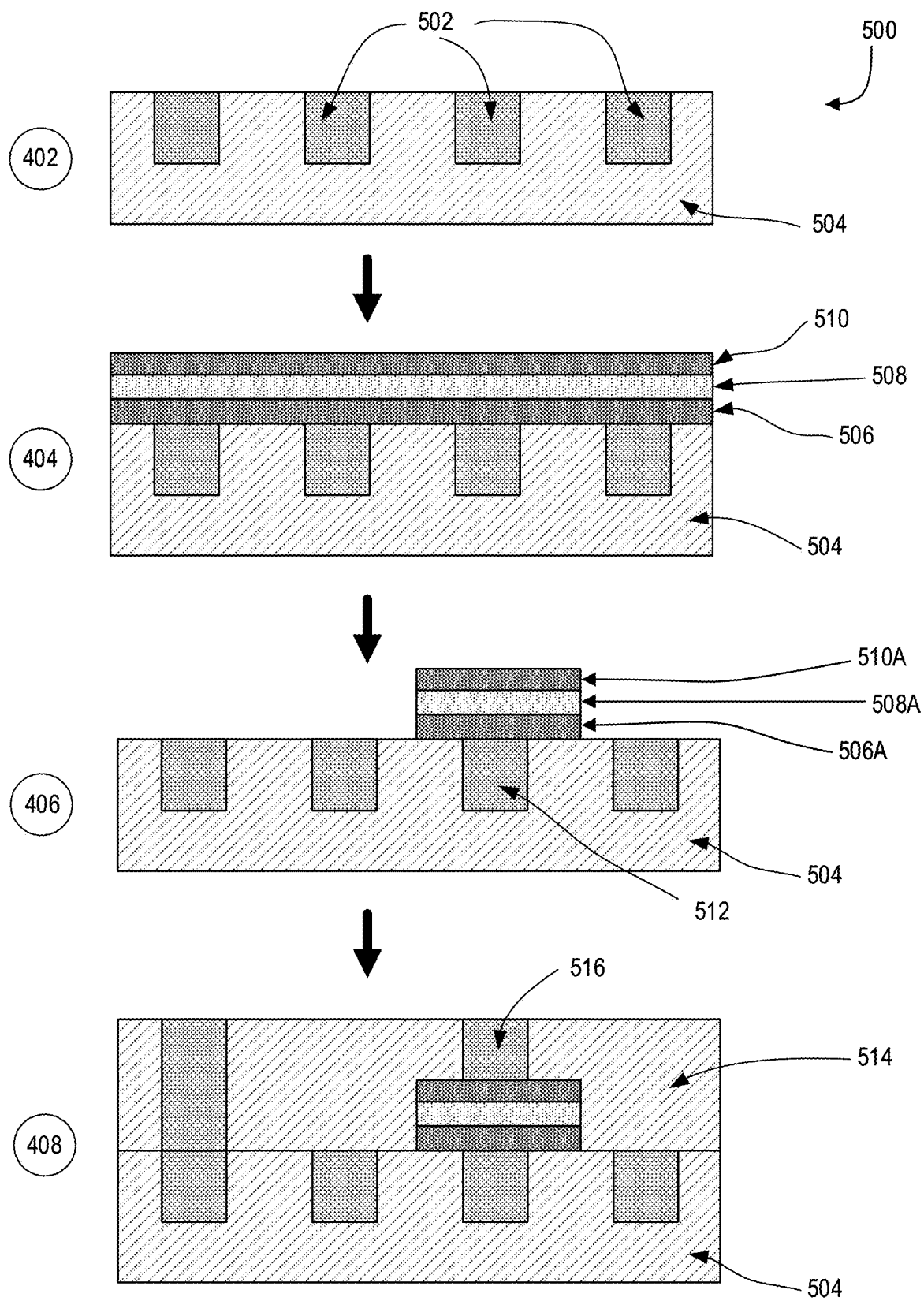
FIG. 5A illustrates cross-sectional views of the process of forming the backend ESD Diode, in accordance with some embodiments.

FIG. 5A illustrates a cross-sectional view of the IC device illustrating processes 500 (corresponding to methods 400 of FIG. 4A) for forming the backend ESD Diode, in accordance with some embodiments.

Processes 500 begins at operation 402 (corresponding to operation 402 in FIG. 4A) where a first ILD is received. The first ILD includes a spaced patterned metal interconnect lines (502), and Inter Level Dielectric (504).

At operation 404 (corresponding to operation 404 in FIG. 4A), the backend ESD diode is deposited on the first ILD. The formation process may further entail first forming a metallic structure (506). Any deposition process may be employed, for example to form any of metallic layer described here. The operation 404 continues with depositing a second insulator or semiconductor structure (508). Any deposition process may be employed, for example to form any of the second structure described here. Next, the operation 404 continues with depositing the metallic structure (510). Any deposition process may be employed, for example to form any of the metallic structure.

In some embodiments, the metal material may include one or more of: Ru, N, Ti, Ta, Al, N, W, Ir, Si, C, or Mo. For example, the metal material may include one of: TiN, TaN, TiAlN, TiSiN, TaC or TaAln. In other embodiments, the metal material may include a compound of: Ru, N, Ti, Ta, Al, N, W, Ir, Si, C, or Mo.

In some embodiments, the insulator or semiconductor material includes at least one of: Mg, Al, Si, Ga, Ge, O, Hf, Ti, Ta, Zr, W, or Ni. For example, the material of the second structure 204 may include: HfOx, TiOx, TaOx, NiOx, SiGe, ZrOx, WOx. In other embodiments, the metal material of the second structure 204 may include a compound of: Mg, Al, Si, Ga, Ge, O, Hf, Ti, Ta, Zr, W, or Ni.

In other embodiments, the second structure may be doped by a doping material, and the doping material may include at least one of: a Trivalent element, a Pentavalent element, arsenic, boron, phosphorus, or Gallium.

At operation 406 (corresponding to operation 406 in FIG. 4A), the backend ESD diode deposited on the first ILD layer is etched (506B, 508B, 510B). The etching is done such that the backend ESD diode is coupled to merely a selected metallic interconnect line in the first ILD layer (512).

Processes 500A continue at operation 408 (corresponding to operation 408 in FIG. 4A) where the second ILD layer (514) is formed. The operation is performed such that the backend ESD diode structure is coupled to merely a selected metallic interconnect line in the second ILD (516).

Figure 5B:
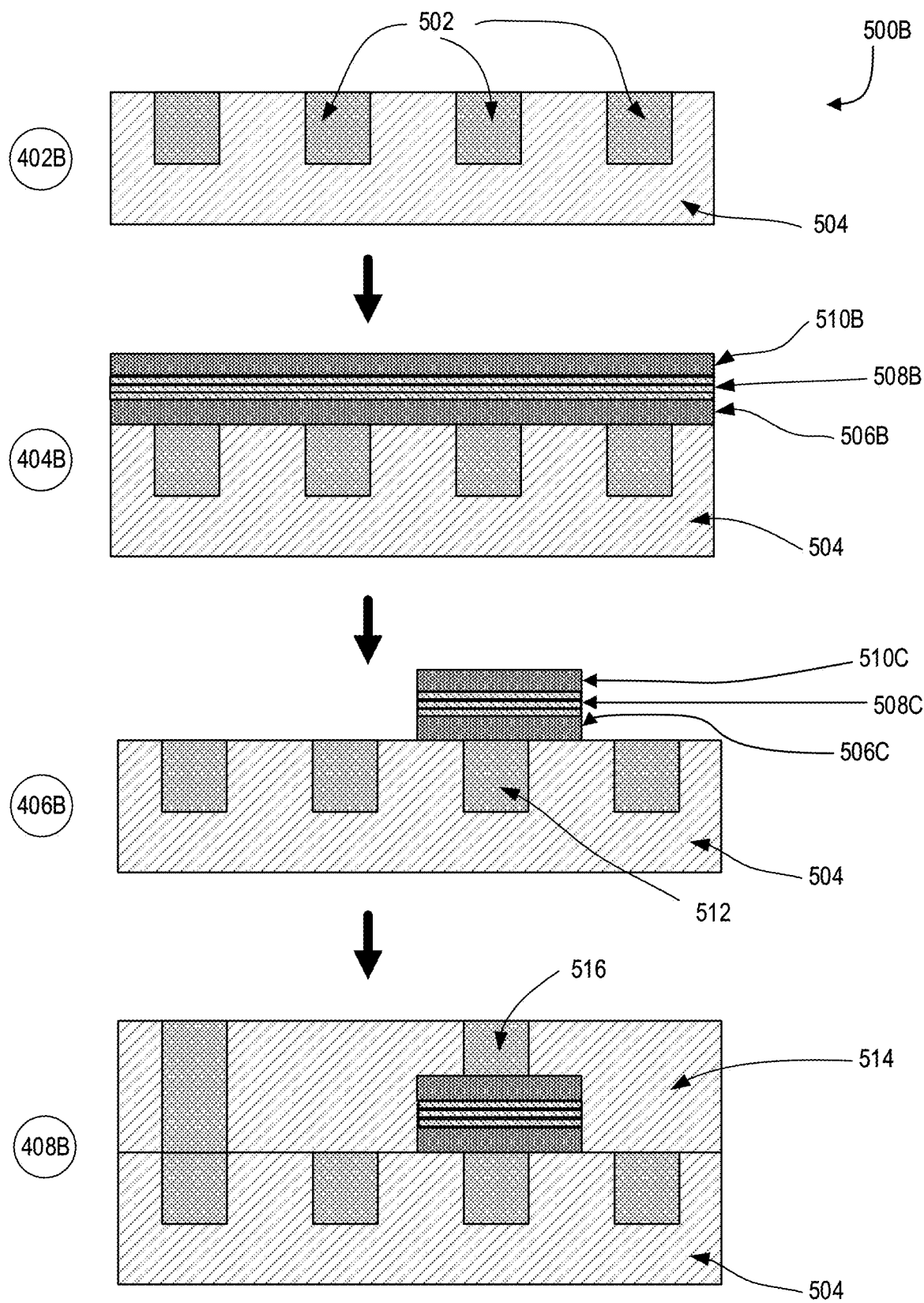
FIG. 5B illustrates cross-sectional views of the process of forming the multilayer Diode heterostructure, in accordance with some embodiments.

FIG. 5B illustrates a cross-sectional view of the IC device illustrating processes 500B (corresponding to methods 400B of FIG. 4B) for forming the backend ESD Diode, in accordance with some embodiments.

Processes 500B begins at operation 402B (corresponding to operation 402B in FIG. 4B) where a first ILD is received. The first ILD includes a spaced patterned metal interconnect lines (502), and Inter Level Dielectric (504).

At operation 404B (corresponding to operation 404B in FIG. 4B), the multilayer diode hetero-structure is deposited on the first ILD. The formation process may further entail first forming a metallic structure (506B). Any deposition process may be employed, for example to form any of metallic layer described here. The operation 404B continues with depositing the second insulator or semiconductor heterostructure (508B corresponding to heterostructure 300). Any suitable deposition process may be employed, for example to form any of the second heterostructure described here. In some embodiments, the stack of insulator and semiconductor material of the hetero-structure are repeated at least 2 or more times. Next, the operation 404B continues with depositing the metallic structure (510B). Any deposition process may be employed, for example to form any of the metallic structure.

In some embodiments, the metal material may include one or more of: Ru, N, Ti, Ta, Al, N, W, Ir, Si, C, or Mo. For example, the metal material may include one of: TiN, TaN, TiAlN, TiSiN, TaC or TaAln. In other embodiments, the metal material may include a compound of: Ru, N, Ti, Ta, Al, N, W, Ir, Si, C, or Mo.

In some embodiments the insulator or semiconductor layer material includes at least one of: Mg, Al, Si, Ga, Ge, O, Hf, Ti, Ta, Zr, W, or Ni. In other embodiments, the second structure may be doped by a doping material, and the doping material may include at least one of: a Trivalent element, a Pentavalent element, arsenic, boron, phosphorus, or Gallium.

At operation 406B (corresponding to operation 406B in FIG. 4B), the multilayer diode hetero-structure deposited on the first ILD layer is etched (506C, 508C, 510C). The etching is done such that the multilayer diode hetero-structure is coupled to merely a selected metallic interconnect line in the first ILD layer (512).

Processes 500B continue at operation 408B (corresponding to operation 408B in FIG. 4B) where the second ILD layer (514) is formed. The operation is performed such that the multilayer diode hetero-structure is coupled to merely a selected metallic interconnect line in the second ILD (516).

Figure 5C:
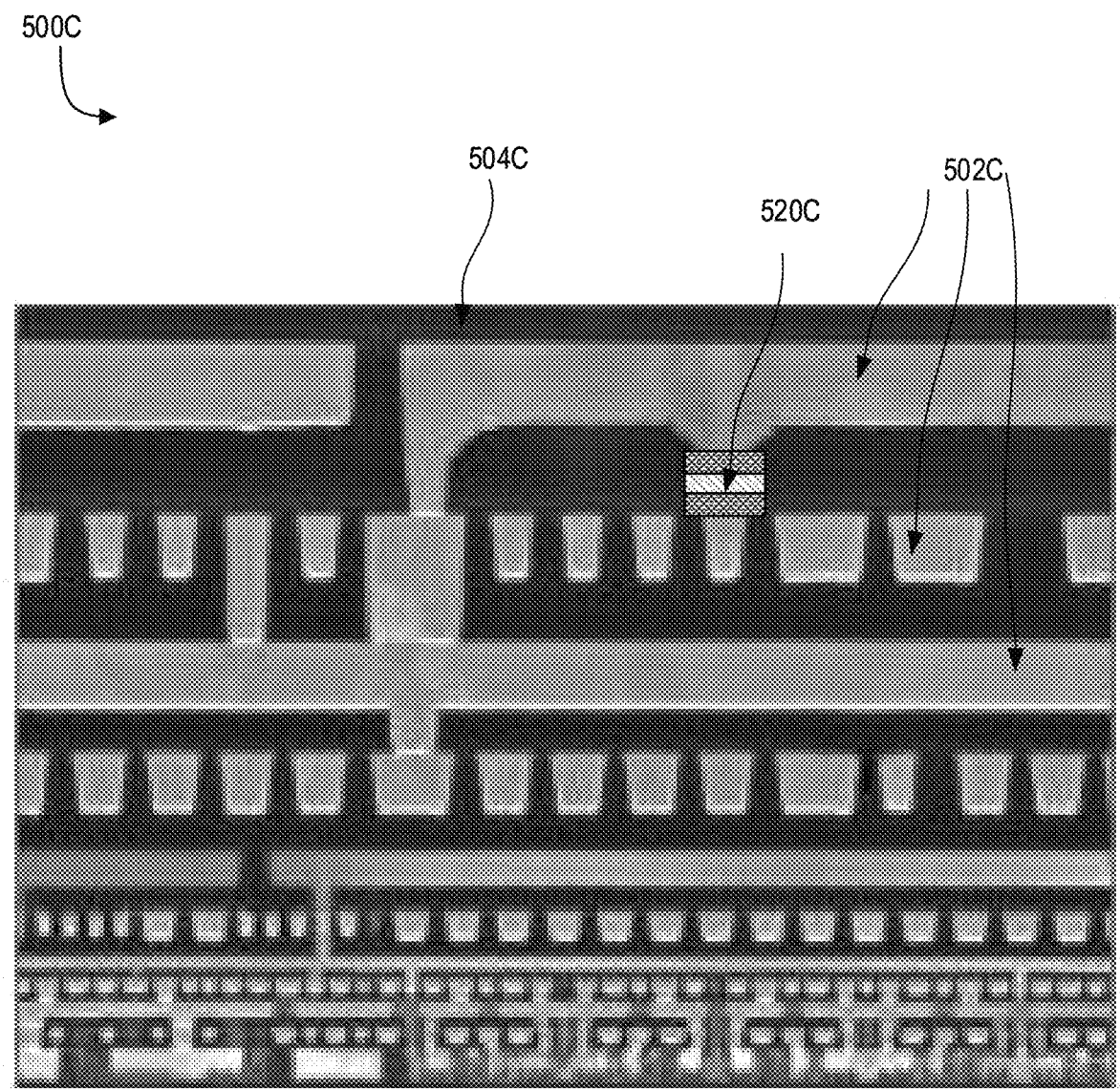
FIG. 5C illustrates an example of a backend ESD Diode integrated in a far backend stack, in accordance with some embodiments.

FIG. 5C illustrates an example of a backend ESD diode integrated in a far backend stack (500C) of an IC device, in accordance with some embodiments. In some embodiments, the far backend stack may include patterned metallic interconnects 502C. In some embodiments, the far backend stack may include ILD 504C. In some embodiments, the far end backend stack includes an integrated backend ESD diode 520C.

Figure 6:
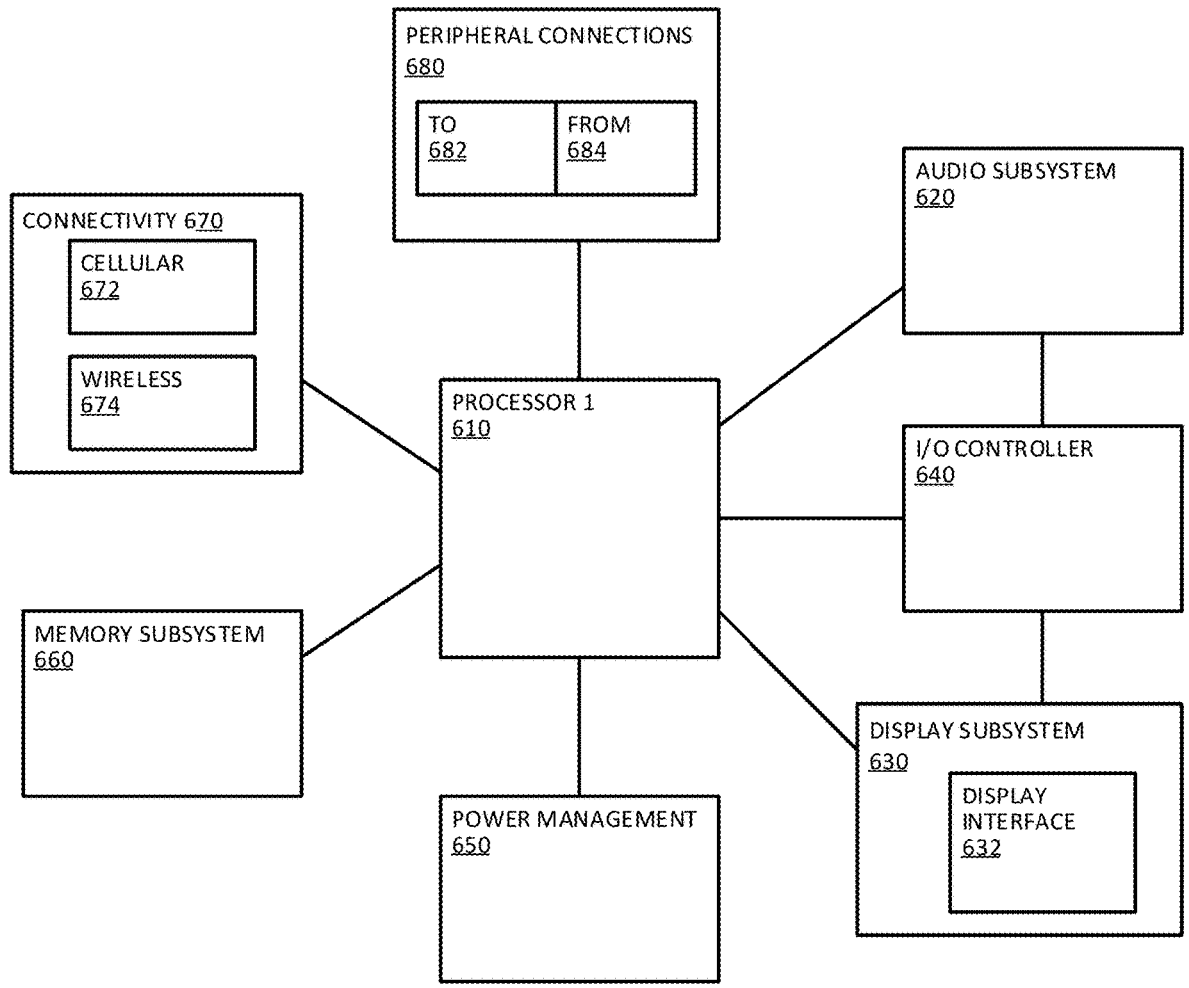
FIG. 6 illustrates a smart device or a computer system or a SoC (System-on-Chip) which includes a backend ESD Diode structure, in accordance with some embodiments.

FIG. 6 illustrates a smart device or a computer system or a SoC (System-on-Chip) which includes a backend ESD diode structure, according to some embodiments. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600. In some embodiments, one or more components of computing device 600, for example cellular 672 and/or wireless 674, include a backend ESD diode as described with reference to various embodiments, for example coupled with a transceiver.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors—BJT PNP/NPN, BiCMOS, CMOS, etc., may be used without departing from the scope of the disclosure.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Connectivity 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Figure 7:
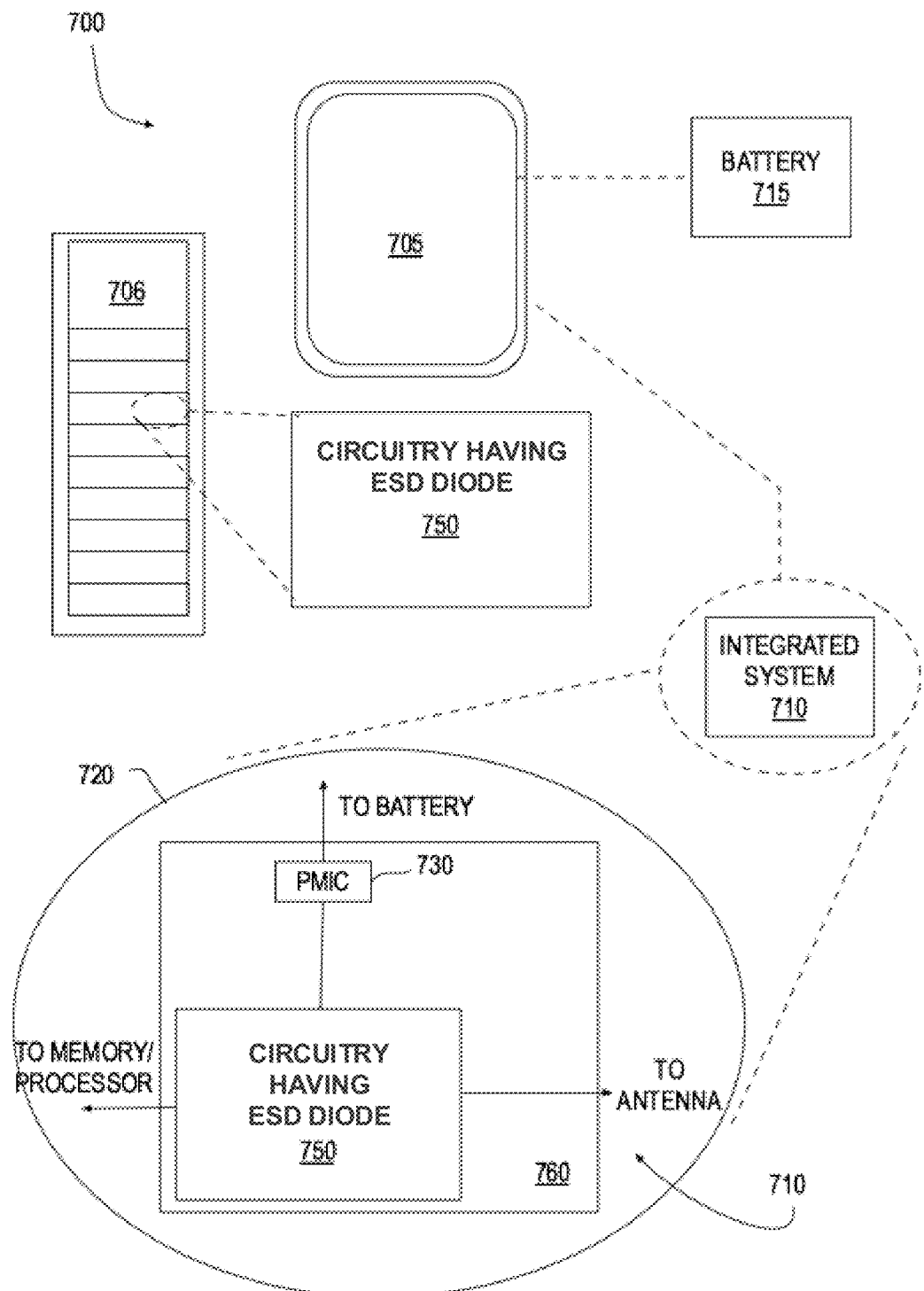
FIG. 7 illustrates a mobile computing platform and a data server machine employing an IC having a backend ESD diode, in accordance with embodiments.

FIG. 7 illustrates a system 700 in which a mobile computing platform 705 and/or a data server machine 706 employs circuitry including at least one embedded or integrated ESD diode, for example in accordance with some embodiments described elsewhere herein. The server machine 706 may be any commercial server, for example including any number of high-performance computing platforms disposed within a rack and networked together for electronic data processing, which in the exemplary embodiment includes a circuitry 750. The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), a chip-level or package-level integrated system 710, and a battery 715.

Whether disposed within the integrated system 710 illustrated in the expanded view 720, or as a stand-alone discrete or packaged multi-chip module within the server machine 706, the circuit includes at least one embedded or integrated ESD diode, for example in accordance with some embodiments described elsewhere herein. Circuitry 750 may be further attached to a board, a substrate, or an interposer 760 along with a power management integrated circuit (PMIC). Functionally, PMIC 730 may perform battery power regulation, DC-to-DC conversion, etc., and so has an input coupled to battery 715 and with an output providing a current supply to other functional modules.

Circuitry 750, in some embodiments, includes RF (wireless) integrated circuitry (RFIC) further including a wideband RF (wireless) transmitter and/or receiver (TX/RX including a digital baseband and an analog front end module comprising a power amplifier on a transmit path and a low noise amplifier on a receive path). The RFIC includes at least one embedded or integrated ESD diode, for example in an over-voltage protection circuit as describe elsewhere herein. The RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one example, a diode device structure is provided comprising: a first structure comprising a first material, wherein the first material includes metal; a second structure adjacent to the first structure, wherein the second structure comprises a second material, wherein the second material includes a semiconductor or an oxide; and a third structure adjacent to the second structure, wherein the third structure comprises of the first material, wherein the second structure is between the first and third structures.

In some embodiments, the first material includes one of: Ru, N, Ti, Ta, Al, N, W, Ir, Si, C, or Mo. In some embodiments, the second material include at least one of: Mg, Al, Si, Ga, Ge, O, Hf, Ti, Ta, Zr, W, or Ni. In some embodiments, the second material is a doped material. In some embodiments, the doped material includes one of: a Trivalent element, a Pentavalent element, arsenic, boron, phosphorus, or Gallium. In some embodiments, the first or third structures have a thickness in a range of 5 nm to 20 nm. In some embodiments, the second structure has a thickness in a range of 1 nm to 4 nm.

In another example, a device structure is provided comprising: a first structure comprising a first material, wherein the first material comprises a metal; a second structure comprising a hetero-structure of a second material and a third material, wherein the second structure is adjacent to the first structure; and a third structure adjacent to the second structure, wherein the third structure comprises of the first material, wherein the second structure is between the first and second structures.

In some embodiments, the second material includes an insulating material, and wherein the third material includes a semiconductor material. In some embodiments, the second and third materials of the heterostructure are repeated at least 2 or more times. In some embodiments, the first and third materials include one of: Ru, N, Ti, Ta, Al, N, W, Ir, Si, C, or Mo. In some embodiments, the second material include at least one of: Mg, Al, Si, Ga, Ge, O, Hf, Ti, Ta, Zr, W, or Ni. In some embodiments, the second material is doped by a doping material. In some embodiments, the doping material comprises of at least one of: a Trivalent element, a Pentavalent element, arsenic, boron, phosphorus, or Gallium.

In one example, a system is provided comprising: a memory; a processor coupled to the memory, the processor including: one or more transistors positioned in a frontend of a die; and an electrostatic discharge (ESD) circuitry coupled to the one or more transistors, wherein the ESD circuitry includes a diode positioned in a backend of the die, wherein the diode comprises: a first structure comprising a first material, wherein the first material includes metal; a second structure adjacent to the first structure, wherein the second structure comprises a second material, wherein the second material includes a semiconductor or an oxide; and a third structure adjacent to the second structure, wherein the third structure comprises of the first material, wherein the second structure is between the first and third structures; and a wireless interface to allow the processor to communicate with another device.

In some embodiments, the first material includes one of: Ru, N, Ti, Ta, Al, N, W, Ir, Si, C, or Mo. In some embodiments, the second material include at least one of: Mg, Al, Si, Ga, Ge, O, Hf, Ti, Ta, Zr, W, or Ni. In some embodiments, the second material is a doped material. In some embodiments, the doped material includes one of: a Trivalent element, a Pentavalent element, arsenic, boron, phosphorus, or Gallium. In some embodiments, the first or third structures have a thickness in a range of 5 nm to 20 nm. In some embodiments, the second structure has a thickness in a range of 1 nm to 4 nm.

In another example, an electric circuit is provided comprising: one or more transistors; and wherein one or more of the transistors are coupled to a device structure, the device structure comprising: a first structure comprising a first material, wherein the first material comprises a metal; a second structure comprising a hetero-structure of a second material and a third material, wherein the second structure is adjacent to the first structure; and a third structure adjacent to the second structure, wherein the third structure comprises of the first material, wherein the second structure is between the first and second structures.

In some embodiments, the second material includes an insulating material, and wherein the third material includes a semiconductor material. In some embodiments, the second and third materials of the heterostructure are repeated at least 2 or more times. In some embodiments, the first and third materials include one of: Ru, N, Ti, Ta, Al, N, W, Ir, Si, C, or Mo. In some embodiments, the second material include at least one of: Mg, Al, Si, Ga, Ge, O, Hf, Ti, Ta, Zr, W, or Ni. In some embodiments, the second layer is doped by a doping material. In some embodiments, the doping material comprises of at least one of: a Trivalent element, a Pentavalent element, arsenic, boron, phosphorus, and Gallium.

In another example, a system is provided comprising: a display subsystem; a wireless communication interface; and an integrated circuit device, the integrated circuit device comprising: a first structure comprising a first material, wherein the first material includes metal; a second structure adjacent to the first structure, wherein the second structure comprises a second material, wherein the second material includes a semiconductor or an oxide; and a third structure adjacent to the second structure, wherein the third structure comprises of the first material, wherein the second structure is between the first and third structures.

In another example, a method of forming a backend ESD diode device structure is provided comprising: receiving a first backend structure; forming an ESD diode stack adjacent to the first backend structure; etching the ESD diode stack; and forming a second backend structure adjacent to the ESD diode stack;

In some embodiments, the first and second backend structures comprise of a patterned metals in an interlayer dielectric (ILD). In another embodiment, the ESD diode stack is etched to connect to one metal element of the patterned metals in ILD.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC) comprising:
   a transistor within a frontend region of the IC; and
   a diode within a backend region of the IC, wherein the diode is within a circuit coupled to the transistor, and wherein the diode comprises:
   a first terminal comprising a metal;
   a second terminal comprising a metal; and
   an insulator or semiconductor material structure between the first and second terminals.

2. The IC of claim 1, wherein the circuit is an electrostatic discharge (ESD) protection circuit and the diode is one of one or more diode structures within the ESD protection circuit.

3. The IC of claim 2, wherein the first terminal is coupled to a supply rail to which the transistor is also coupled and wherein the diode structure is to become forward biased upon a voltage surge between the supply rail and another circuit node to which both the second terminal and the transistor are coupled.

4. The IC of claim 3, wherein the diode structure has a turn on voltage greater than that of the transistor.

5. The IC of claim 1, wherein the insulator or semiconductor material structure comprises Mg, Al, Si, Ga, Ge, O, Hf, Ti, Ta, Zr, W, or Ni.

6. The IC of claim 5, wherein the insulator or semiconductor material structure comprises metal and oxygen.

7. The IC of claim 6, wherein the insulator or semiconductor material structure comprises HfOx, TiOx, TaOx, NiOx, ZrOx, or WOx.

8. The IC of claim 1, wherein the first terminal or second terminal comprises Ru, Ti, Ta, Al, N, W, Ir, Si, C, or Mo.

9. The IC of claim 1, wherein the first terminal or second terminal comprises TiN, TaN, TiAlN, TiSiN, TaC or TaAln.

10. The IC of claim 1, wherein the insulator or semiconductor material structure is a hetero-structure comprising a stack of insulator or semiconductors material layers.

11. The IC of claim 10, wherein material layers of the hetero-structure are repeated two or more times.

12. An integrated circuit (IC) comprising:
    a transistor within a frontend region of the IC; and
    a diode within a backend region of the IC, wherein the diode is within a circuit coupled to the transistor, and wherein the diode comprises:
    a first terminal comprising a metal;
    a second terminal comprising a metal; and
    a heterostructure of an insulating material and a semiconductor material between the first and second terminals.

13. The IC of claim 12, wherein the heterostructure is repeated two or more times within the insulator or semiconductor material structure.

14. The IC of claim 12, wherein the heterostructure comprises three semiconductor material layers separated by two intervening insulator layers.

15. The IC of claim 14, wherein a first of the three semiconductor material layers is in contact with the first terminal and wherein a second of the three semiconductor material layers is in contact with the second terminal.

16. A system comprising:
    a memory;
    a processor coupled to the memory, the processor including:
    one or more transistors positioned in a frontend of a die; and
    a diode within a backend region of the processor, wherein the diode is within a circuit coupled to the transistor, and wherein the diode comprises:
    a first terminal comprising a metal;
    a second terminal comprising a metal; and
    an insulator or semiconductor material structure between the first and second terminals.

17. The system of claim 16, wherein:
    the circuit is an electrostatic discharge (ESD) protection circuit and the diode is one of one or more diode structures within the ESD protection circuit;
    the first terminal is coupled to a supply rail to which the transistor is also coupled; and
    the diode is to become forward biased upon a voltage surge between the supply rail and another circuit node to which both the second terminal and the transistor are coupled.

18. The system of claim 16, wherein the diode has a turn on voltage greater than that of the transistor.

19. The system of claim 16, wherein the insulator or semiconductor material structure comprises metal and oxygen.

20. The system of claim 19, wherein the insulator or semiconductor material structure comprises three semiconductor material layers separated by two intervening insulator layers.

* * * * *